United States Patent
Brcka

(10) Patent No.: US 7,132,128 B2
(45) Date of Patent: Nov. 7, 2006

(54) METHOD AND SYSTEM FOR DEPOSITING MATERIAL ON A SUBSTRATE USING A SOLID PRECURSOR

(75) Inventor: Jozef Brcka, Loudonville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/096,159

(22) Filed: Mar. 31, 2005

(65) Prior Publication Data

US 2006/0219177 A1    Oct. 5, 2006

(51) Int. Cl.
*C23C 16/00*    (2006.01)
(52) U.S. Cl. .................. 427/248.1; 118/726
(58) Field of Classification Search .............. 118/726; 427/248.1
See application file for complete search history.

(56) References Cited

U.S. PATENT DOCUMENTS

| | | | | |
|---|---|---|---|---|
| 3,574,672 A | * | 4/1971 | Tarver | 427/249.17 |
| 3,914,515 A | * | 10/1975 | Kane et al. | 428/432 |
| 5,019,531 A | * | 5/1991 | Awaya et al. | 438/605 |
| 5,914,001 A | | 6/1999 | Hansen | 156/345 |
| 6,090,458 A | * | 7/2000 | Murakami | 427/586 |
| 6,431,115 B1 | * | 8/2002 | Komino et al. | 118/723 VE |
| 6,440,494 B1 | * | 8/2002 | Arena-Foster | 427/250 |
| 6,544,345 B1 | | 4/2003 | Mayer et al. | 134/28 |
| 6,909,839 B1 | * | 6/2005 | Wang et al. | 392/389 |
| 2003/0140857 A1 | * | 7/2003 | Umotoy et al. | 118/726 |
| 2004/0086642 A1 | * | 5/2004 | Kesala | 427/248.1 |

FOREIGN PATENT DOCUMENTS

WO   WO 2004/010463 A2    1/2004
WO   WO 2004/035878    *   4/2004

* cited by examiner

*Primary Examiner*—Richard Bueker
(74) *Attorney, Agent, or Firm*—Wood, Herron & Evans, LLP

(57) ABSTRACT

A system and method is disclosed for vaporizing a solid precursor and transporting the precursor vapor to a process chamber. The film precursor vaporization system is coupled to the process chamber and positioned directly above the substrate. A precursor valve system within the film precursor vaporization system permits closing off the flow of precursor vapor to the process chamber while carrier gas flows through or over the film precursor, and once the carrier gas is saturated with precursor vapor, the precursor valve system is opened to permit the flow of precursor vapor to the substrate.

15 Claims, 7 Drawing Sheets

METHOD AND SYSTEM FOR DEPOSITING MATERIAL ON A SUBSTRATE USING A SOLID PRECURSOR

CROSS-REFERENCE TO RELATED APPLICATIONS

This application is related to co-pending U.S. patent application Ser. No. 11/096,156, entitled "Method for Saturating a Carrier Gas with Precursor Vapor", filed on even date herewith, the content of which is herein incorporated by reference in its entirety.

BACKGROUND OF THE INVENTION

1. Field of the Invention

The present invention relates to a system for thin film deposition, and more particularly to a system for vaporizing a film precursor and delivering the vapor to a deposition chamber.

2. Description of Related Art

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperatures between about 400° C. and about 500° C., or lower.

For example, Cu integration schemes for technology nodes less than or equal to 130 nm currently utilize a low dielectric constant (low-k) inter-level dielectric, followed by a physical vapor deposition (PVD) TaN layer and Ta barrier layer, followed by a PVD Cu seed layer, and an electrochemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, these studies including such materials as chromium, tantalum, molybdenum and tungsten. Each of these materials exhibits low miscibility in Cu. More recently, other materials, such as ruthenium (Ru) and rhodium (Rh), have been identified as potential barrier layers since they are expected to behave similarly to conventional refractory metals. However, the use of Ru or Rh can permit the use of only one barrier layer, as opposed to two layers, such as Ta/TaN. This observation is due to the adhesive and barrier properties of these materials. For example, one Ru layer can replace the Ta/TaN barrier layer. Moreover, current research is finding that the one Ru layer can further replace the Cu seed layer, and bulk Cu fill can proceed directly following Ru deposition. This observation is due to good adhesion between the Cu and the Ru layers.

Conventionally, Ru layers can be formed by thermally decomposing a ruthenium-containing precursor, such as a ruthenium carbonyl precursor, in a thermal chemical vapor deposition (TCVD) process. Material properties of Ru layers that are deposited by thermal decomposition of metal carbonyl precursors (e.g., $Ru_3(CO)_{12}$), can deteriorate when the substrate temperature is lowered to below about 400° C. As a result, an increase in the (electrical) resistivity of the Ru layers and poor surface morphology (e.g., the formation of nodules) at low deposition temperatures has been attributed to increased incorporation of CO reaction by-products into the thermally deposited Ru layers. Both effects can be explained by a reduced CO desorption rate from the thermal decomposition of the ruthenium carbonyl precursor at substrate temperatures below about 400° C.

Additionally, the use of metal carbonyls, such as ruthenium carbonyl, can lead to poor deposition rates due to their low vapor pressure, and the transport issues associated therewith. For instance, transport issues can include excessive decomposition of the precursor vapor on internal surfaces of the deposition system, such as on the internal surfaces of the vapor delivery system used to transport the vapor from the vaporization system to the process chamber, thus further reducing the amount of precursor vapor that reaches the substrate surface. Overall, the inventor has observed that current deposition systems suffer from such a low rate, making the deposition of such metal films impractical.

SUMMARY OF THE INVENTION

The present invention provides a deposition system for forming a thin film on a substrate in which a film precursor vaporization system is integrated with the process chamber, rather than remote therefrom. The deposition system comprises a process chamber having a substrate holder configured to support the substrate and heat the substrate, and a pumping system configured to evacuate the process chamber; and a film precursor vaporization system coupled to the process chamber above the substrate and configured to vaporize a film precursor, and to transport film precursor vapor in a carrier gas. The film precursor vaporization system comprises a housing positioned above the process chamber and having an opening in the bottom of the housing that is in general alignment with an opening in the top of the process chamber. A precursor tray is supported within the housing and an annular space is formed between the precursor tray and the housing. The precursor tray is configured to support the film precursor, and is coupled to a carrier gas supply system configured to flow the carrier gas through or over the film precursor, through the annular space, and through the opening in the bottom of the housing.

The present invention further provides a method of depositing a thin film on a substrate using the above-described deposition system. The method comprises: disposing the substrate on the substrate holder in the process chamber of the deposition system; introducing a film precursor to the film precursor vaporization system in the deposition system; flowing a carrier gas from the carrier gas supply system through the film precursor vaporization system; heating the film precursor to form the film precursor vapor in the carrier gas; and exposing the substrate to the film precursor vapor.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
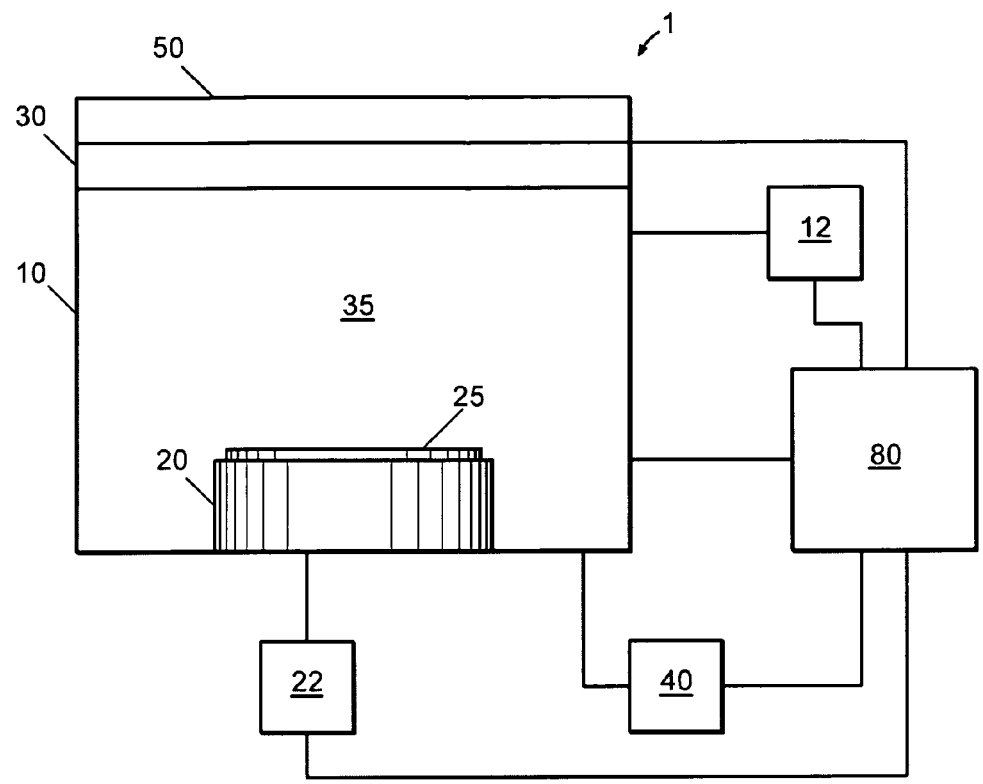
FIG. 1 depicts a schematic view of a deposition system according to an embodiment of the invention.

Referring now to the drawings, wherein like reference numerals designate identical or corresponding parts throughout the several views, FIG. 1 illustrates a deposition system 1 for depositing a thin film, such as a ruthenium (Ru) or a rhenium (Re) metal film, on a substrate according to one embodiment. The deposition system 1 comprises a process chamber 10 having a substrate holder 20 configured to support a substrate 25, upon which the thin film is formed. The process chamber 10 is coupled to a film precursor vaporization system 50.

The process chamber 10 is further coupled to a vacuum pumping system 40, wherein the pumping system 40 is configured to evacuate the process chamber 10 and film precursor vaporization system 50 to a pressure suitable for forming the thin film on substrate 25, and suitable for vaporization of a film precursor (not shown) in the film precursor vaporization system 50.

Referring still to FIG. 1, the film precursor vaporization system 50 is coupled directly to process chamber 10. The film precursor vaporization system 50 is configured to store a film precursor and heat the film precursor to a temperature sufficient for vaporizing the film precursor, while introducing vapor phase film precursor to the process chamber 10. As will be discussed in more detail below with reference to FIGS. 2–9, the film precursor can, for example, comprise a solid film precursor. Additionally, for example, the film precursor can include a solid metal precursor. Additionally, for example, the film precursor can include a metal carbonyl. For instance, the metal carbonyl can include ruthenium carbonyl ($Ru_3(CO)_{12}$), or rhenium carbonyl ($Re_2(CO)_{10}$). Additionally, for instance, the metal carbonyl can include $W(CO)_6$, $Mo(CO)_6$, $Co_2(CO)_8$, $Rh_4(CO)_{12}$, $Cr(CO)_6$, or $Os_3(CO)_{12}$. Additionally, the film precursor vaporization system 50 can optionally comprise a vapor distribution system 30 configured to disperse the film precursor vapor above substrate 25 in the process chamber 10.

In order to achieve the desired temperature for vaporizing the film precursor (or subliming a solid metal precursor), the film precursor vaporization system 50 is coupled to a vaporization temperature control system (not shown) configured to control the vaporization temperature. For instance, the temperature of the film precursor is generally elevated to approximately 40–45° C. in conventional systems in order to sublime, for example, ruthenium carbonyl. At this temperature, the vapor pressure of the ruthenium carbonyl, for instance, ranges from approximately 1 to approximately 3 mTorr. As the film precursor is heated to cause evaporation (or sublimation), a carrier gas is passed over the film precursor or by the film precursor. The carrier gas can include, for example, an inert gas, such as a noble gas (i.e., He, Ne, Ar, Kr, Xe), or a monoxide, such as carbon monoxide (CO), for use with metal carbonyls, or a mixture thereof. For example, a carrier gas supply system (not shown) is coupled to the film precursor vaporization system 50, and it is configured to, for instance, supply the carrier gas above the film precursor via a feed line (not shown). In another example, the carrier gas supply system is coupled to the vapor distribution system 30 and is configured to supply the carrier gas to the vapor of the film precursor via another feed line (not shown) as or after it enters the vapor distribution system 30. Although not shown, the carrier gas supply system can comprise a gas source, one or more control valves, one or more filters, and a mass flow controller. For instance, the flow rate of carrier gas can range from approximately 5 sccm (standard cubic centimeters per minute) to approximately 1000 sccm. For example, the flow rate of carrier gas can range from about 10 sccm to about 200 sccm. By way of further example, the flow rate of carrier gas can range from about 20 sccm to about 100 sccm.

Referring again to FIG. 1, the optional vapor distribution system 30, coupled to the process chamber 10, comprises a plenum (not shown) within which the vapor disperses prior to passing through a vapor distribution plate (not shown) and entering a processing zone 35 above substrate 25. In addition, the vapor distribution plate can be coupled to a distribution plate temperature control system (not shown) configured to control the temperature of the vapor distribution plate. For example, the temperature of the vapor distribution plate can be set to a value approximately equal to the vaporization temperature. However, it may be less, or it may be greater.

Once film precursor vapor enters the processing zone 35, the film precursor vapor thermally decomposes upon adsorption at the substrate surface due to the elevated temperature of the substrate 25, and the thin film is formed on the substrate 25. The substrate holder 20 is configured to elevate the temperature of substrate 25, by virtue of the substrate holder 20 being coupled to a substrate temperature control system 22. For example, the substrate temperature control system 22 can be configured to elevate the temperature of substrate 25 up to approximately 500° C. In one embodiment, the substrate temperature can range from about 100° C. to about 500° C. In another embodiment, the substrate temperature can range from about 300° C. to about 400° C. Additionally, process chamber 10 can be coupled to a chamber temperature control system 12 configured to control the temperature of the chamber walls.

As described above, for example, conventional systems have contemplated operating the film precursor vaporization system 50, within a temperature range of approximately 40–45° C. for ruthenium carbonyl in order to limit metal vapor precursor decomposition, and metal vapor precursor condensation. For example, ruthenium carbonyl precursor can decompose at elevated temperatures to form by-products, such as those illustrated below:

$$Ru_3(Co)_{12}*(ad) \Leftrightarrow Ru_3(CO)_x*(ad)+(12-x)CO(g) \quad (1)$$

or, $$Ru_3(CO)_x*(ad) \Leftrightarrow 3Ru(s)+xCO(g) \quad (2)$$

wherein these by-products can adsorb, i.e., condense, on the interior surfaces of the deposition system 1. The accumulation of material on these surfaces can cause problems from one substrate to the next, such as process repeatability. Alternatively, for example, ruthenium carbonyl precursor can condense at depressed temperatures to cause recrystallization, viz.

$$Ru_3(CO)_{12}(g) \Leftrightarrow Ru_3(CO)_{12}*(ad) \quad (3)$$

However, within such systems having a small process window, the deposition rate becomes extremely low, due in part to the low vapor pressure of ruthenium carbonyl. For instance, the deposition rate can be as low as approximately 1 Angstrom per minute. Therefore, according to one embodiment, the vaporization temperature is elevated to be greater than or equal to approximately 40° C. Alternatively, the vaporization temperature is elevated to be greater than or equal to approximately 50° C. In an exemplary embodiment of the present invention, the vaporization temperature is elevated to be greater than or equal to approximately 60° C. In a further exemplary embodiment, the vaporization temperature is elevated to range from approximately 60–100° C., and for example from approximately 60–90° C. The elevated temperature increases the vaporization rate due to the higher vapor pressure (e.g., nearly an order of magnitude larger) and, hence, it is expected by the inventors to increase the deposition rate. It may also be desirable to periodically clean deposition system 1 following processing of one or more substrates. For example, additional details on a cleaning method and system can be obtained from co-pending U.S. patent application Ser. No. 10/998,394, filed on Nov. 29, 2004, and entitled "Method and System for Performing In-Situ Cleaning of a Deposition System", which is herein incorporated by reference in its entirety.

As discussed above, the deposition rate is proportional to the amount of film precursor that is vaporized and transported to the substrate prior to decomposition, or condensation, or both. Therefore, in order to achieve a desired deposition rate, and to maintain consistent processing performance (i.e., deposition rate, film thickness, film uniformity, film morphology, etc.) from one substrate to the next, it is important to provide the ability to monitor, adjust, or control the flow rate of the film precursor vapor. In conventional systems, an operator may indirectly determine the flow rate of film precursor vapor by using the vaporization temperature, and a pre-determined relationship between the vaporization temperature and the flow rate. However, processes and their performance drift in time, and hence it is imperative that the flow rate is measured more accurately. For example, additional details can be obtained from co-pending U.S. patent application Ser. No. 10/998,393, filed on Nov. 29, 2004, and entitled "Method and System for Measuring a Flow Rate in a Solid Precursor Delivery System", which is herein incorporated by reference in its entirety.

Still referring the FIG. 1, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, and the film precursor vaporization system 50.

Figure 2:
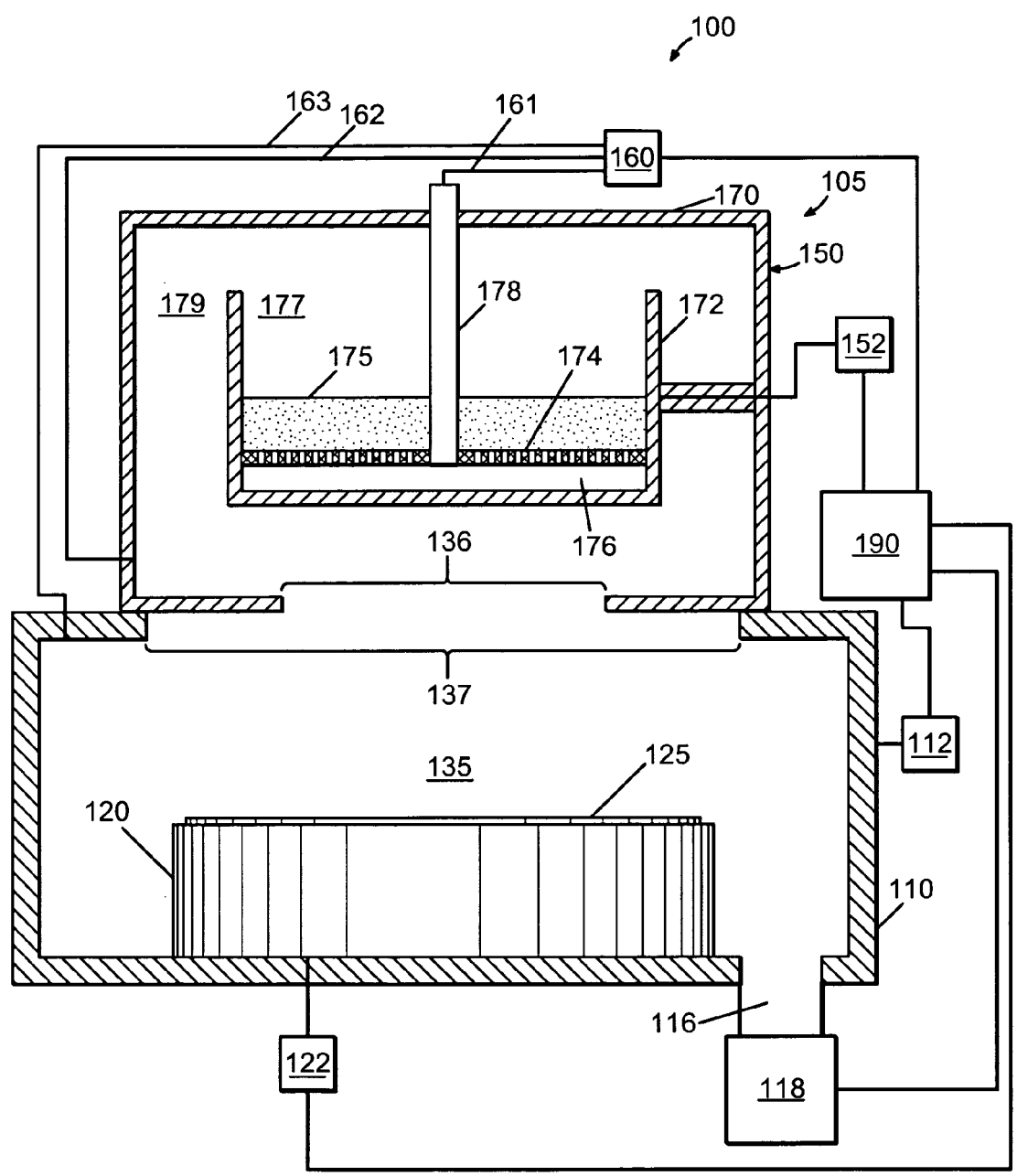
FIG. 2 depicts a schematic view of a deposition system according to another embodiment of the invention.
Figure 3:
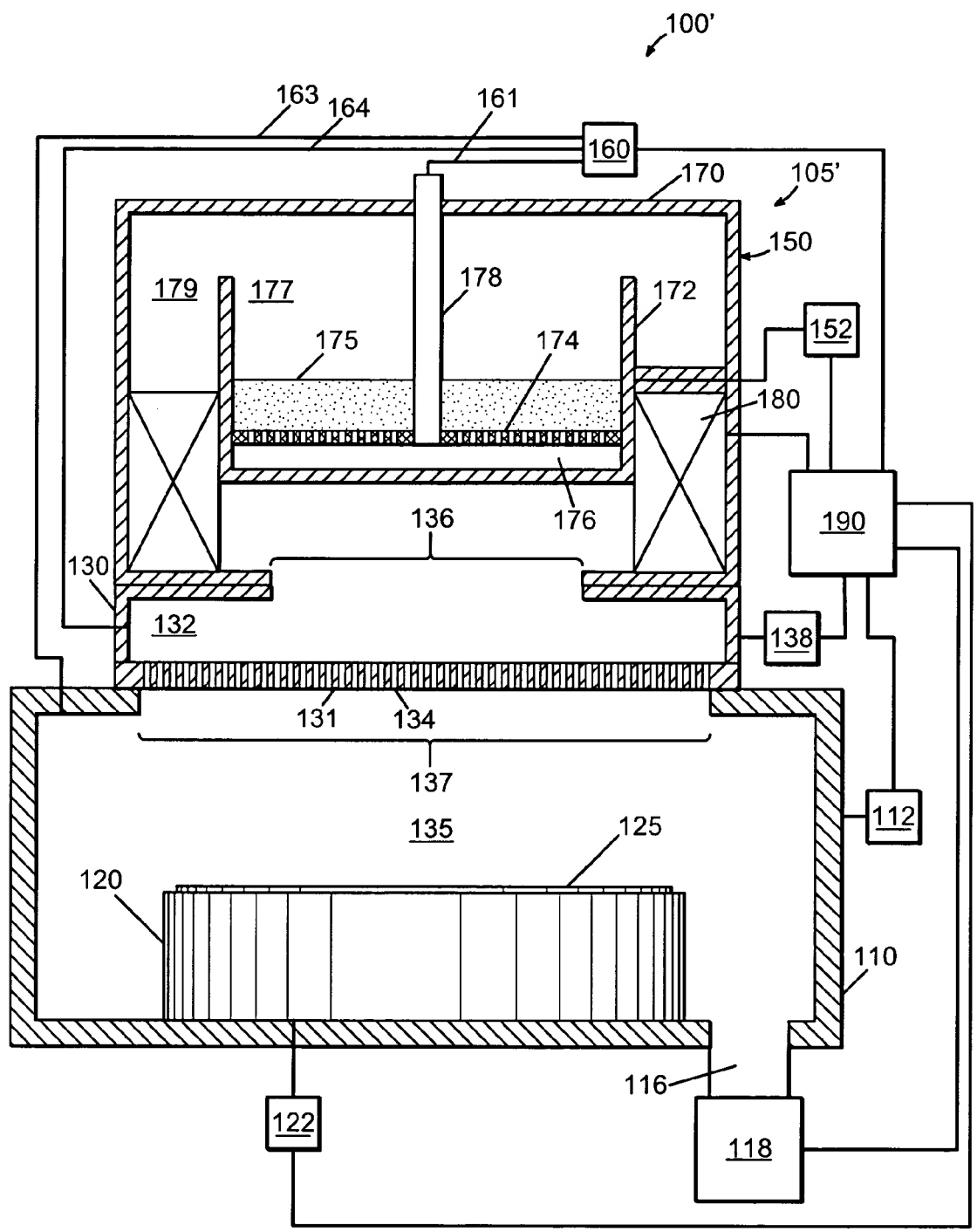
FIG. 3 depicts a schematic view of a deposition system according to another embodiment of the invention.

FIGS. 2 and 3 illustrate alternative embodiments of a deposition system 100, 100' for depositing a thin film, such as a ruthenium (Ru) or a rhenium (Re) metal film, on a substrate. The deposition systems 100, 100' comprise a process chamber 110 having a substrate holder 120 configured to support a substrate 125, upon which the thin film is formed. The process chamber 110 is coupled to a precursor delivery system 105, 105' having film precursor vaporization system 150 positioned above the process chamber 110 and configured to store and vaporize a film precursor 175. An opening 136 is provided in the bottom of the vaporization system 150 for introducing vapor precursor to the process chamber 110 from the precursor delivery system 105, 105'. Opening 136 is in general alignment with an opening 137 in the top of process chamber 110. Thus, the vaporization system 150 is essentially integrated with the process chamber 110 such that gas line delivery of precursor vapor from a remote vaporization system is eliminated. In the embodiment shown in FIG. 3, the precursor delivery system 105' further comprises a vapor distribution system 130 positioned between film precursor vaporization system 150 and process chamber 110 and configured to disperse the film precursor vapor in process space 135 above substrate 125.

Referring still to FIGS. 2 and 3, substrate holder 120 provides a horizontal surface to support substrate (or wafer) 125, which is to be processed. Furthermore, the substrate holder 120 comprises a temperature control element (not shown), such as a heater, coupled to substrate holder temperature control system 122. The heater can, for example, include one or more resistive heating elements. Alternately, the heater can, for example, include a radiant heating system, such as a tungsten-halogen lamp. The substrate holder temperature control system 122 can include a power source for providing power to the one or more heating elements, one or more temperature sensors for measuring the substrate temperature, or the substrate holder temperature, or both, and a controller configured to perform at least one of monitoring, adjusting, or controlling the temperature of the substrate or substrate holder.

During processing, the heated substrate 125 can thermally decompose the vapor of film precursor vapor, such as a metal carbonyl precursor, and enable deposition of a thin film, such as a metal layer, on the substrate 125. According to one embodiment, the film precursor includes a solid precursor. According to another embodiment, the film precursor includes a metal precursor. According to another embodiment, the film precursor includes a solid metal precursor. According to yet another embodiment, the film precursor includes a metal carbonyl precursor. According to yet another embodiment, the film precursor can be a ruthenium carbonyl precursor, for example $Ru_3(CO)_{12}$. According to yet another embodiment of the invention, the film precursor can be a rhenium carbonyl precursor, for example $Re_2(CO)_{10}$. As will be appreciated by those skilled in the art of thermal chemical vapor deposition, other ruthenium carbonyl precursors and rhenium carbonyl precursors can be used without departing from the scope of the invention. In yet another embodiment, the film precursor can be $W(CO)_6$, $Mo(CO)_6$, $Co_2(CO)_8$, $Rh_4(CO)_{12}$, $Cr(CO)_6$, or $Os_3(CO)_{12}$.

The substrate holder 120 is heated to a pre-determined temperature that is suitable for depositing, for instance, a desired Ru, Re, or other metal layer onto the substrate 125. Additionally, a heater (not shown), coupled to a chamber temperature control system 112, can be embedded in the walls of process chamber 110 to heat the chamber walls to a pre-determined temperature. The heater can maintain the temperature of the walls of process chamber 110 from about 40° C. to about 100° C., for example from about 40° C. to about 80° C. A pressure gauge (not shown) is used to measure the process chamber pressure.

Referring specifically to FIG. 3, an optional vapor distribution system 130 is coupled to process chamber 110. Vapor distribution system 130 comprises a vapor distribution plate 131 configured to introduce precursor vapor from vapor distribution plenum 132 to a processing zone 135 above substrate 125 through one or more orifices 134.

Furthermore, the vapor distribution system 130 is positioned at the opening 136 provided in the bottom of the vaporization system 150 for receiving vapor precursor from the vaporization system 150 and introducing it into vapor distribution plenum 132 for distribution to the processing zone 135 through opening 137. Moreover, temperature control elements (not shown), such as concentric fluid channels configured to flow a cooled or heated fluid, are provided for controlling the temperature of the vapor distribution system 130, and thereby prevent the decomposition of the film precursor inside the vapor distribution system 130. For instance, a fluid, such as water, can be supplied to fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 100° C. Referring again to both FIGS. 2 and 3, film precursor vaporization system 150 is configured to hold a film precursor 175, and to evaporate (or sublime) the film precursor by elevating its temperature. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. A precursor heater (not shown) is provided for heating the film precursor 175 to maintain the film precursor at a temperature that produces a desired vapor pressure of film precursor. The precursor heater is coupled to a vaporization temperature control system 152 configured to control the temperature of the film precursor 175. For example, the precursor heater can be configured to adjust the temperature of the film precursor (or vaporization temperature) to be greater than or equal to approximately 40° C. Alternatively, the vaporization temperature is elevated to be greater than or equal to approximately 50° C. For example, the vaporization temperature is elevated to be greater than or equal to approximately 60° C. In one embodiment, the vaporization temperature is elevated to range from approximately 60–100° C., and in another embodiment, to range from approximately 60–90° C.

As the film precursor is heated to cause evaporation (or sublimation), a carrier gas can be passed over the film precursor 175, or by the film precursor 175, or through the film precursor 175. For example, a carrier gas supply system 160 is coupled to the film precursor vaporization system 150 via gas line 161, and it is configured to, for instance, supply the carrier gas below the film precursor 175. Additionally, carrier gas supply system 160 can also be coupled to the precursor delivery system 105, 105' downstream of the film precursor 175, proximate the opening 136. In FIG. 2, carrier gas supply system 160 can be coupled to film precursor vaporization system 150 above the opening 136 via gas line 162. Alternatively, or additionally, as shown in FIG. 3, carrier gas supply system 160 can be coupled to the vapor distribution system 130 below opening 136 via gas line 164 to supply the carrier gas to the vapor of the film precursor as or after it enters the vapor distribution system 130. Additionally, as shown in FIGS. 2 and 3, carrier gas supply system 160 can also be coupled to the process chamber 110 via gas line 163 to supply the carrier gas to the vapor of the film precursor as or after it enters the process chamber 110.

The carrier gas can include, for example, an inert gas, such as a noble gas (i.e., He, Ne, Ar, Kr, Xe), or a monoxide, such as carbon monoxide (CO), for use with metal carbonyls, or a mixture thereof. The carrier gas supply system 160 can comprise a gas source (not shown), one or more control valves (not shown), one or more filters (not shown), and a mass flow controller (not shown). For instance, the flow rate of carrier gas can range from approximately 5 sccm (standard cubic centimeters per minute) to approximately 1000 sccm. In one embodiment, for instance, the flow rate of carrier gas can range from about 10 sccm to about 200 sccm. In another embodiment, for instance, the flow rate of carrier gas can range from about 20 sccm to about 100 sccm.

Referring still to FIGS. 2 and 3, the film precursor vaporization system 150 comprises a housing 170 configured to enclose and support a precursor tray 172. An annular space 179 is defined by the sidewall of housing 170 and precursor tray 172, thereby creating a flow channel for the film precursor vapor from the precursor tray 172 through the annular space 179 to the opening 136 in the bottom of the film precursor vaporization system 150. The precursor tray 172 comprises a carrier gas distribution plate 174 configured to support the film precursor 175 and form a carrier gas plenum 176 at the bottom of the precursor tray 172. Additionally, a carrier gas line 178 is coupled to carrier gas supply system 160, and configured to supply carrier gas to the carrier gas plenum 176. The carrier gas, originating from the carrier gas supply system 160, enters the film precursor vaporization system 150 through carrier gas line 178 to carrier gas plenum 176, flows through the film precursor resting atop the carrier gas distribution plate 174, enters the vaporization space 177, flows through the annular space 179, and enters the process chamber 110 through opening 136 (see FIG. 2) or, alternatively, enters the vapor distribution system 130 through opening 136 (see FIG. 3). Although the carrier gas flows through the film precursor, other embodiments may provide for flowing the carrier over the film precursor. The film precursor may comprise a solid powder form, or it may comprise a solid tablet form. In the latter, additional details for preparing the solid precursor in solid tablet form can be ascertained from pending U.S. patent application Ser. No. 11/007,961, filed on Dec. 9, 2004, and entitled "Method for Preparing Solid Precursor Tray for Use in Solid Precursor Evaporation System", the entire content of which is incorporated herein by reference in its entirety.

Referring now to FIG. 3, the film precursor vaporization system 150 can comprise a precursor valve system 180 positioned in the flow channel and configured to open and close the flow of vapor precursor from the film precursor vaporization system 150 into the process chamber 110. According to an embodiment, the precursor valve system 180 is closed while carrier gas enters the film precursor vaporization system 150 through the film precursor 175, and fills the vaporization space 177 and the annular space 179 with carrier gas and precursor vapor. The flow of carrier gas occurs for a period of time, and then it is terminated using a valve in the carrier gas supply system 160. For instance, the period of time may be sufficiently large to permit the pressure in the film precursor vaporization system 150 to stabilize. For a given vaporization temperature, the precursor will reach a specific vapor pressure and, since the volume of the vaporization space 177 and the annular space 179 is known, the amount of precursor vapor to be delivered to substrate 125 is known. Once the carrier gas in the vaporization space 177 and annular space 179 is saturated with precursor vapor, the precursor valve system 180 is opened in order to permit transport of the precursor vapor to the surface of substrate 125.

Figure 4:
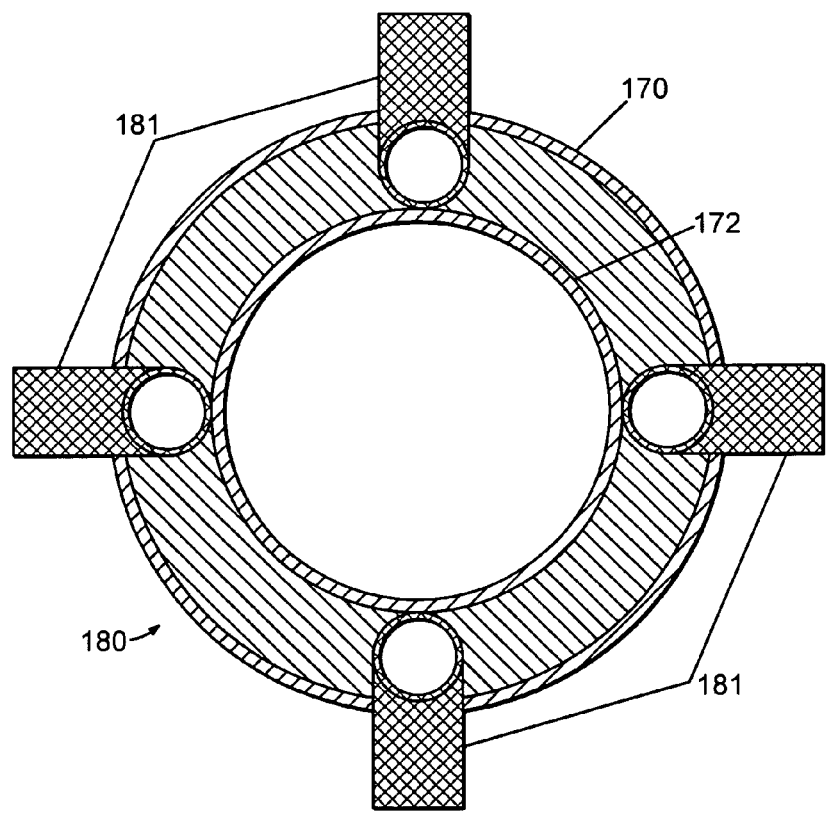
FIG. 4 presents in cross-sectional view a film precursor vaporization system according to an embodiment of the invention.

In FIG. 3, the precursor valve system 180 is positioned within the annular space 179. As shown in FIG. 4, the precursor valve system 180 comprises one or more valves 181 located within and, for instance, equally spaced along the annular space 179, which is defined by the sidewall of housing 170 and tray 172. Although four valves 181 are illustrated, more or less may be utilized. Each valve 181 can, for example, comprise a gate valve, a butterfly valve, or an angle valve.

Figure 5:
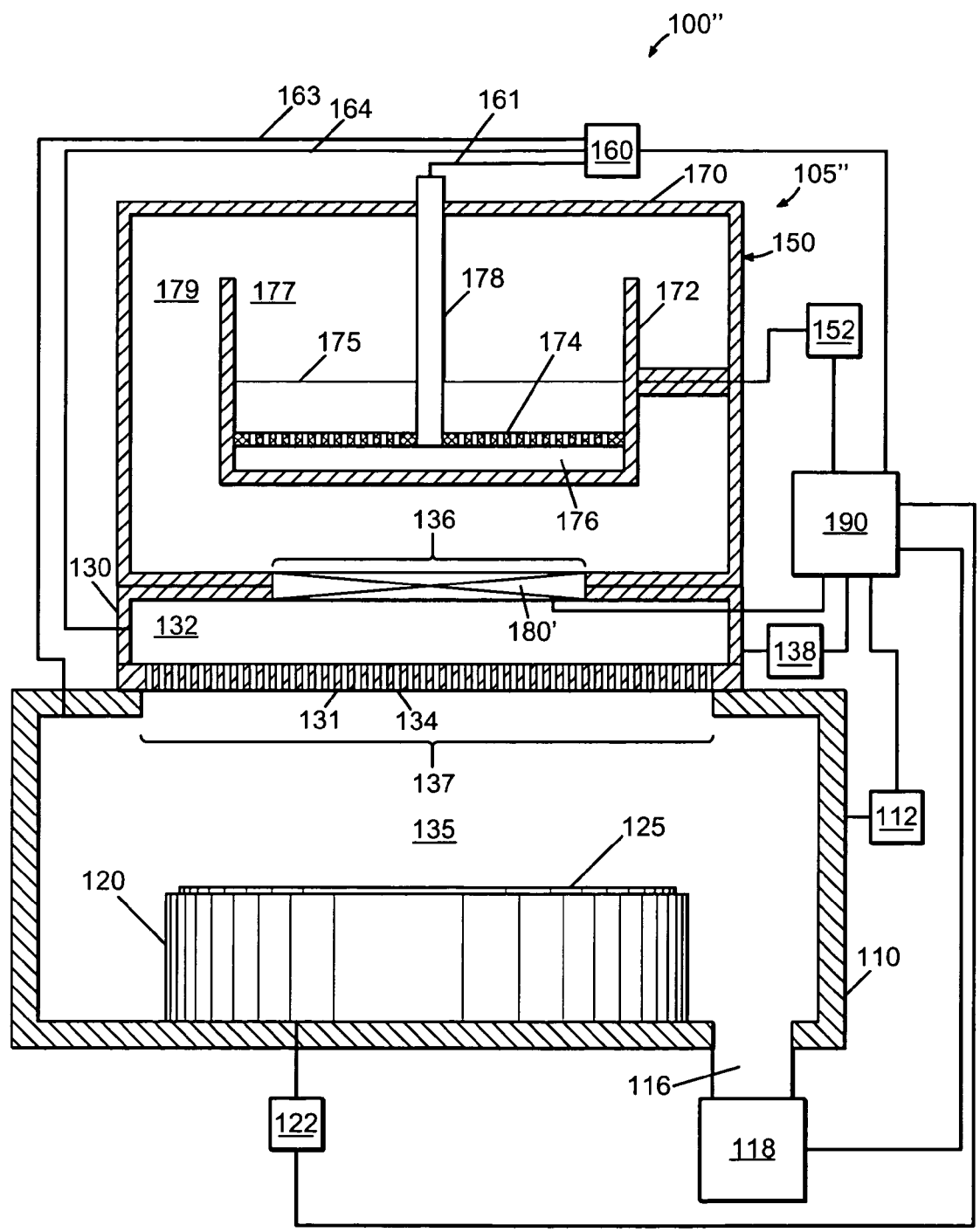
FIG. 5 presents in cross-sectional view a film precursor vaporization system according to another embodiment of the invention.

Referring now to FIG. 5, a deposition system 100" is depicted according to another embodiment of an alternative precursor delivery system 105". The deposition system 100" is similar to deposition system 100' of FIG. 3, but rather than positioning a valve system in the annular space 179 of the flow channel, deposition system 100" comprises a precursor valve system 180' positioned in the flow channel at the opening 136 between the film precursor vaporization system 150 and the vapor distribution system 130. The precursor valve system 180' can, for example, comprise a gate valve. As with valve system 180, precursor valve system 180' is configured to open and close the flow of vapor precursor from the film precursor vaporization system 150 into the process chamber 110.

Figure 6:
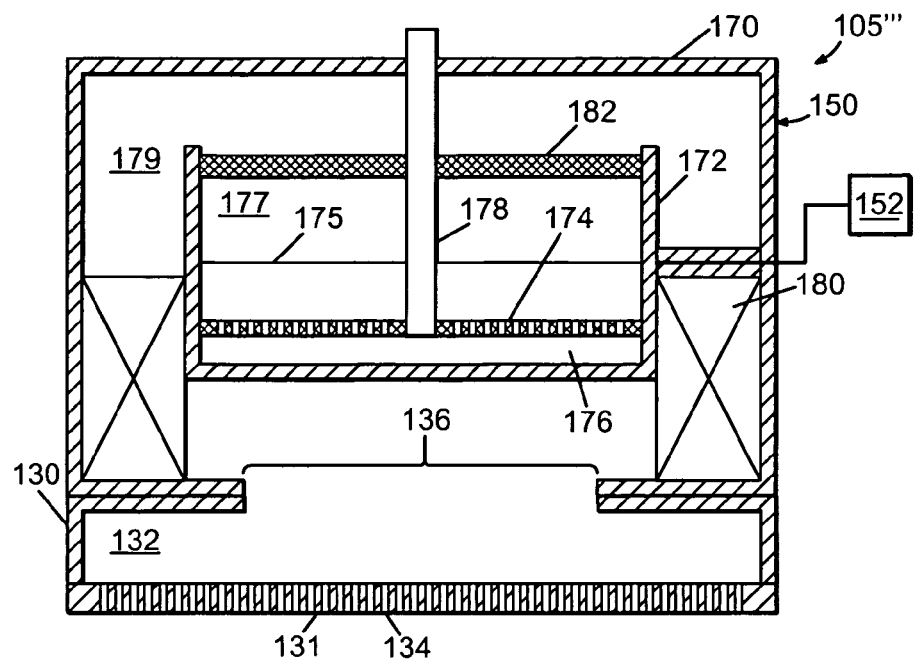
FIG. 6 presents in cross-sectional view a film precursor vaporization system according to another embodiment of the invention.
Figure 7:
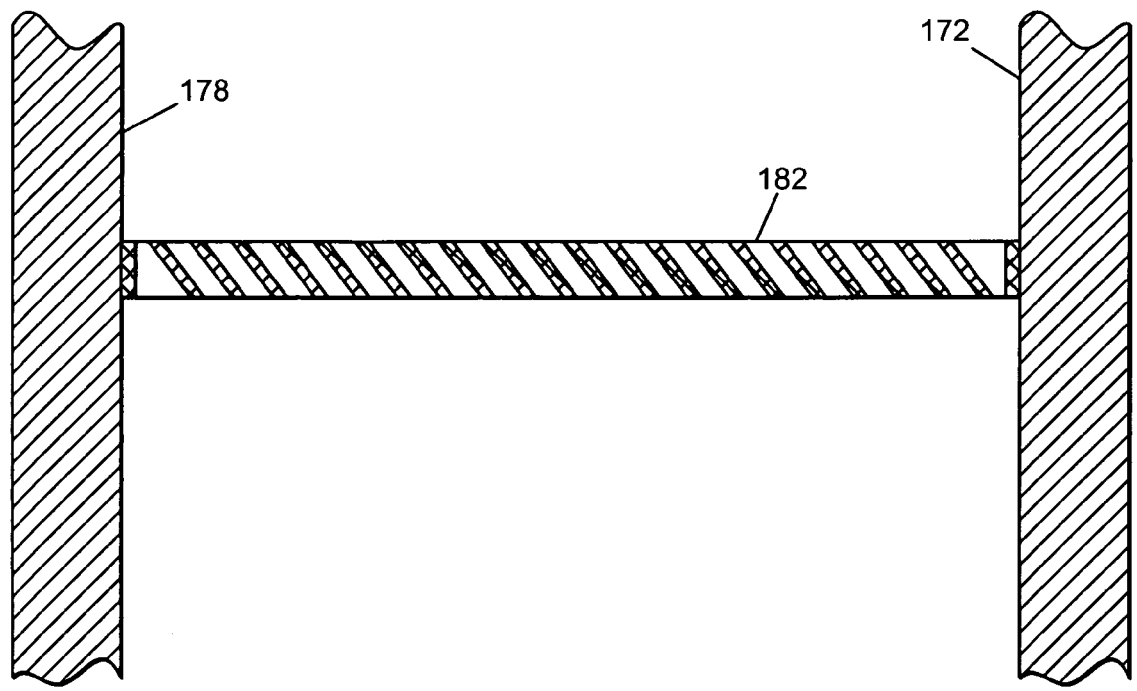
FIG. 7 illustrates a baffle plate for use in a film precursor vaporization system according to an embodiment of the invention.

Referring now to FIG. 6, which depicts alternative precursor delivery system 105''', when a solid precursor in powder form is utilized, an optional baffle plate 182 may be employed to prevent a burst of solid particulate from reaching the annular space 179 of the film precursor vaporization system 150. The transport of solid particulate out of the precursor tray 172 can lead to particulate contamination in process chamber 110. The optional baffle plate 182 can, for instance, comprise a design of slanted openings, such as that illustrated in FIG. 7.

Figure 8:
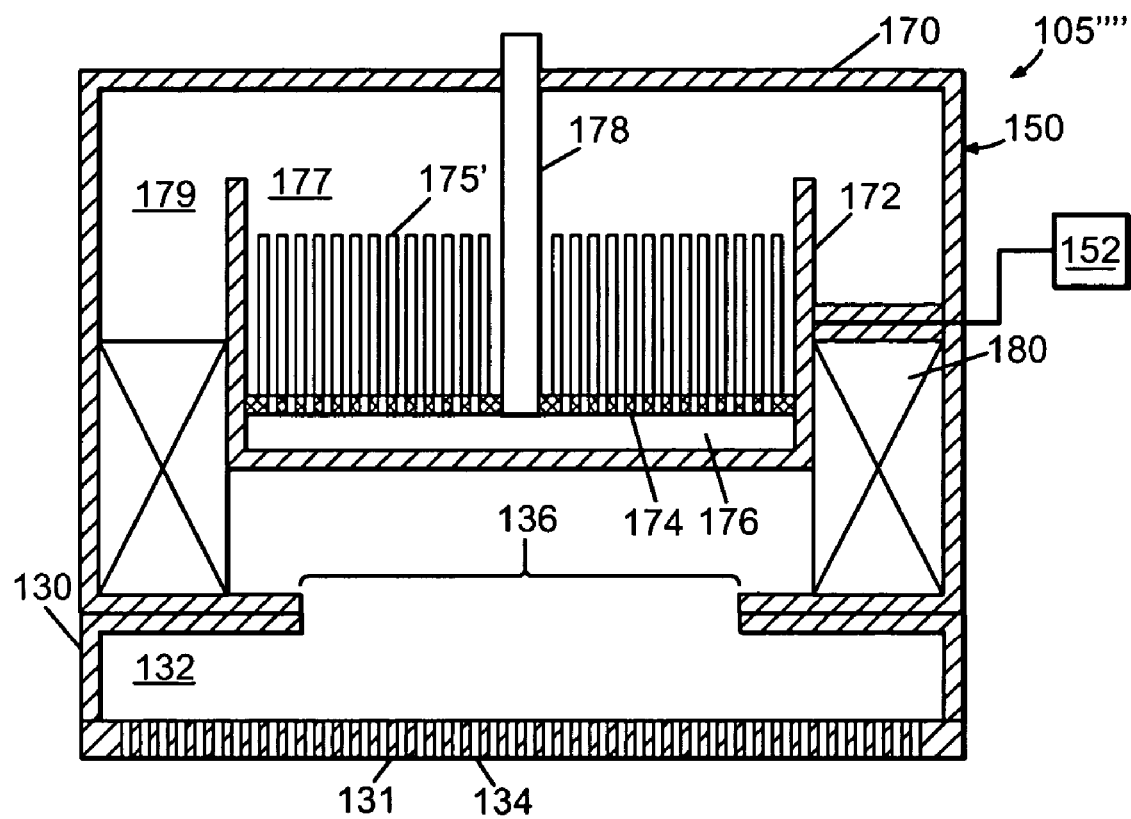
FIG. 8 presents in cross-sectional view a film precursor vaporization system according to another embodiment of the invention.

Referring now to FIG. 8, which depicts alternative precursor delivery system 105, the precursor tray 172 can support a solid precursor in solid tablet form, as described above. The precursor 175' can comprise cylindrical elements arranged concentrically in such a way that the carrier gas flows through the annular space between cylindrical precursor elements. Additional details regarding such an arrangement of solid precursor elements is described in pending U.S. patent application Ser. No. 11/096,077, filed on even date herewith, and entitled "Solid Precursor Vaporization System for Use in Chemical Vapor Deposition and Method Of Using", the content of which is herein incorporated by reference in its entirety.

Referring again to FIGS. 2 and 3, the vaporization space 177 and the annular space 179 provide for a high conductance flow through the film precursor vaporization system 150. Additionally, the film precursor vaporization system 150 can include an additional temperature control system (not shown) for controlling the wall temperature of housing 170. The housing 170 may or may not be maintained at a temperature different than the temperature of the precursor tray 172. For instance, the temperature of the housing walls can be controlled to avoid condensation of the film precursor. The temperature can be controlled from about 20° C. to about 100° C., or from about 40° C. to about 90° C. For example, the wall temperature of housing 170 can be set to a value approximately equal to or greater than the vaporization temperature.

As illustrated in FIGS. 2 and 3, the process chamber 110 is coupled to a pumping system 118 via an exhaust line 116. The pumping system 118 is used to evacuate process chamber 110 to the desired degree of vacuum, and to remove gaseous species from the process chamber 110 during processing. An automatic pressure controller (APC) (not shown) and a trap (not shown) can be used in series with the pumping system 118. The pumping system 118 can include a turbo-molecular pump (TMP) capable of a pumping speed up to 5000 liters per second (and greater). Alternately, the pumping system 118 can include a dry roughing pump. During processing, the carrier gas, or film precursor vapor, or any combination thereof, can be introduced into the process chamber 110, and the chamber pressure can be adjusted by the APC. For example, the chamber pressure can range from approximately 1 mTorr to approximately 500 mTorr, and in a further example, the chamber pressure can range from about 5 mTorr to about 50 mTorr. The APC can comprise a butterfly-type valve or a gate valve. The trap can collect unreacted precursor material and by-products from the process chamber 110.

Referring back to the substrate holder 120 in the process chamber 110, as shown in FIGS. 2 and 3, a substrate lift system (not shown), such as a substrate lift-pin system, is provided for holding, raising, and lowering the substrate 125. Substrate 125 can be transferred into and out of process chamber 110 through a gate valve (not shown) and a chamber feed-through passage via a robotic transfer system (not shown), and received by the substrate lift system. Once the substrate 125 is received from the transfer system, it can be lowered to the upper surface of the substrate holder 120.

Referring still to FIGS. 2 and 3, a controller 190 includes a microprocessor, a memory, and a digital I/O port capable of generating control voltages sufficient to communicate and activate inputs of the processing system 100 as well as monitor outputs from the processing system 100. Moreover, the processing system controller 190 is coupled to and exchanges information with process chamber 110 and chamber temperature control system 112; precursor delivery system 105, 105' (105", 105''', 105''''), which includes the film precursor vaporization system 150 and the vaporization temperature control system 152; precursor valve system 180, 180'; vapor distribution temperature control system 138; carrier gas supply system 160; vacuum pumping system 118; and substrate holder temperature control system 122. In the vacuum pumping system 118, the controller 190 is coupled to and exchanges information with the automatic pressure controller for controlling the pressure in the process chamber 110. A program stored in the memory is utilized to control the aforementioned components of deposition system 100, 100' (100") according to a stored process recipe. One example of processing system controller 190 is a DELL PRECISION WORKSTATION 610™, available from Dell Corporation, Dallas, Tex. The controller 190 may also be implemented as a general-purpose computer, digital signal process, etc.

Controller 190 may be locally located relative to the deposition system 100, or it may be remotely located relative to the deposition system 100 via an internet or intranet. Thus, controller 190 can exchange data with the deposition system 100, 100' (100") using at least one of a direct connection, an intranet, or the internet. Controller 190 may be coupled to an intranet at a customer site (i.e., a device maker, etc.), or coupled to an intranet at a vendor site (i.e., an equipment manufacturer). Furthermore, another computer (i.e., controller, server, etc.) can access controller 190 to exchange data via at least one of a direct connection, an intranet, or the internet.

Figure 9:
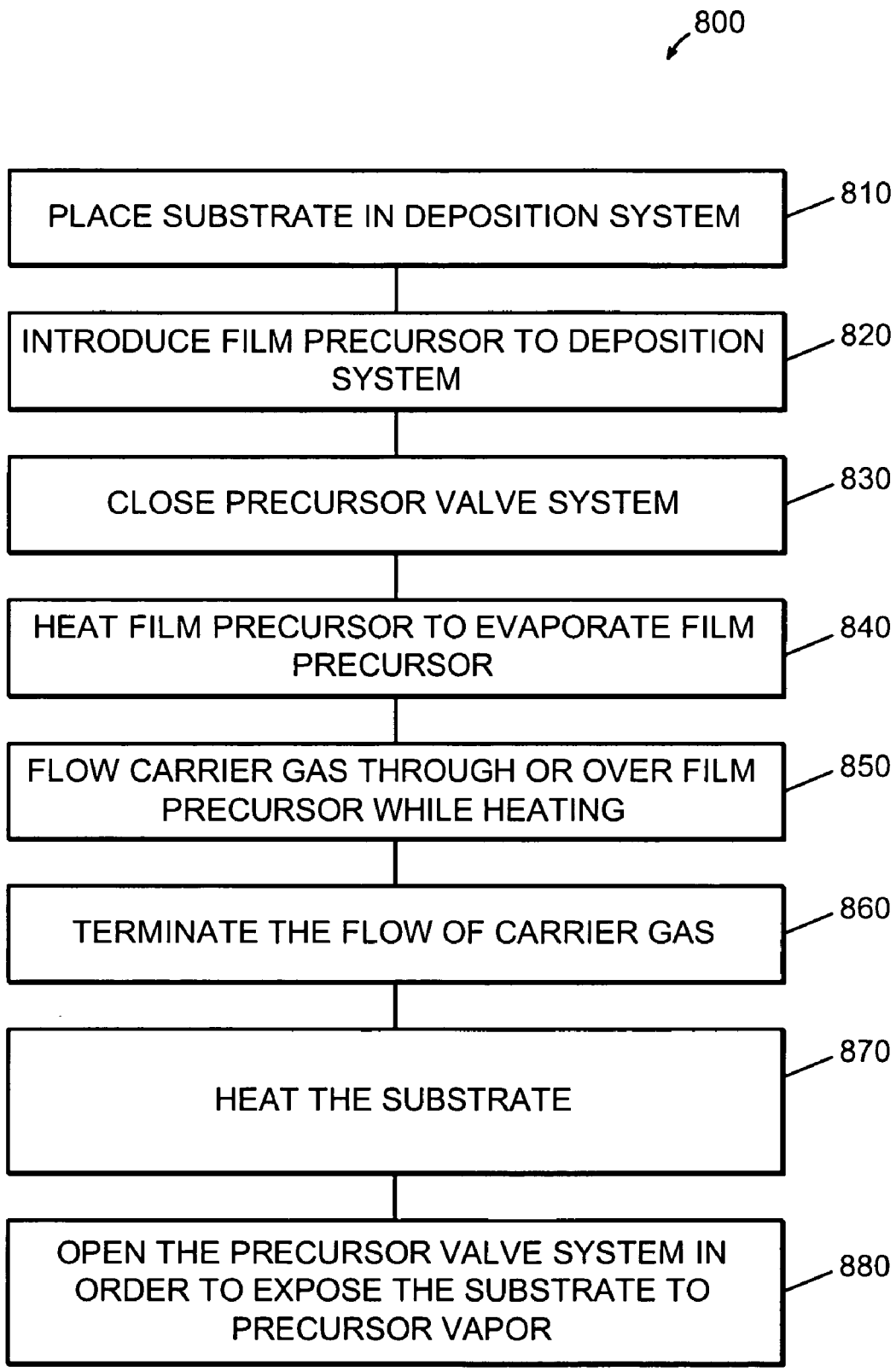
FIG. 9 illustrates a method of operating a deposition system of the invention.

Referring now to FIG. 9, a method of depositing a thin film on a substrate is described. A flow chart 800 is used to illustrate the steps in depositing the thin film in a deposition system of the present invention. The thin film deposition begins in 810 with placing a substrate in the deposition system for forming the thin film on the substrate. For example, the deposition system can include any one of the deposition systems 100, 100', 100" described above in FIGS. 1, 3, and 5. The deposition system can include a process chamber for facilitating the deposition process, and a substrate holder coupled to the process chamber and configured to support the substrate. Then, in 820, a film precursor is introduced to the deposition system. For instance, the film precursor is introduced to a film precursor vaporization system coupled to and integrated with the process chamber.

In 830, a precursor valve system coupled to the film precursor vaporization system is closed in order to prevent precursor vapor from exiting the film precursor vaporization system and entering the process chamber. In 840, the film precursor is heated to form a precursor vapor in the film precursor vaporization system. In 850, a carrier gas passes through, or over, the film precursor while the film precursor is heated. In 860, the flow of carrier gas is terminated. The termination of the flow of carrier gas into the film precursor vaporization system may occur once a pre-specified pressure is achieved within the film precursor vaporization system.

In 870, the substrate is heated to a substrate temperature sufficient to decompose the film precursor vapor. In 880, after a period of time sufficient to permit stabilization of the pressure and of the vaporization process in the film precursor vaporization system, the precursor valve system is opened to permit introduction of the precursor vapor to the process chamber and exposure of the heated substrate to the film precursor vapor. Prior to opening the precursor valve system and while the flow of carrier gas is terminated, the carrier gas within the film precursor vaporization system can become saturated with film precursor vapor. Given the vaporization temperature, the film precursor vapor can achieve a specific partial pressure within the volume of carrier gas. Once saturated (i.e., the partial pressure is achieved), the amount of film precursor vapor delivered to the substrate during exposure can be determined. When the precursor valve system is opened to expose the substrate to precursor vapor, the transport of the precursor vapor and carrier gas already present in the film precursor vaporization system may or may not be accompanied by an additional flow of a carrier gas. Steps 810 to 880 may be repeated successively a desired number of times to deposit a metal film on a desired number of substrates.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A deposition system for forming a thin film on a substrate comprising:

a process chamber having a substrate holder configured to support said substrate and heat said substrate, and a pumping system configured to evacuate said process chamber; and a film precursor vaporization system coupled to said process chamber above said substrate and configured to vaporize a film precursor, and to transport film precursor vapor in a carrier gas, wherein said film precursor vaporization system comprises:

a housing positioned above the process chamber and having an opening in a bottom of said housing that is in general alignment with an opening in a top of said process chamber;

a precursor tray supported within said housing and an annular space formed between said precursor tray and said housing wherein the precursor tray is configured to support said film precursor, and wherein said precursor tray is coupled to a carrier gas supply system configured to flow said carrier gas through or over said film precursor, through said annular space, and through said opening in the bottom of said housing;

a precursor valve system disposed in the annular space and configured to open up or close off the flow of said film precursor vapor through said opening in said housing.

2. The deposition system of claim 1, further comprising: a vapor distribution system coupled between said opening in said housing and said opening in said process chamber, and configured to introduce said film precursor vapor from said film precursor vaporization system to said process chamber and distribute said film precursor above said substrate.

3. The deposition system of claim 1, further comprising a solid film precursor disposed in said precursor tray.

4. The deposition system of claim 3, wherein said solid film precursor comprises a solid powder form.

5. The deposition system of claim 4, wherein said precursor tray comprises a baffle plate configured to prevent the transport of said solid film precursor out of said precursor tray.

6. The deposition system of claim 3, wherein said solid film precursor comprises a solid tablet form.

7. The deposition system of claim 1, further comprising a metal carbonyl film precursor disposed in said precursor tray.

8. The deposition system of claim 7, wherein said metal carbonyl film precursor includes $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$.

9. The deposition system of claim 1, wherein said precursor tray comprises a baffle plate configured to prevent the transport of film precursor out of said precursor tray.

10. The deposition system of claim 1, wherein said precursor valve system comprises one or more valves.

11. The deposition system of claim 10, wherein said one or more valves comprise at least one of a gate valve, an angle valve, or a butterfly valve.

12. The deposition system of claim 1, further comprising a carrier gas distribution plate within said precursor tray configured to support said film precursor, wherein said carrier gas distribution plate forms a carrier gas plenum at a bottom of said precursor tray which is coupled to said carrier gas supply system.

13. The deposition system of claim 1, wherein said precursor tray is coupled to a temperature control system configured to control the temperature of said film precursor.

14. A method of depositing a thin film on a substrate using the deposition system of claim 1, comprising:
- disposing said substrate on said substrate holder in said process chamber;
- introducing a film precursor to said film precursor vaporization system in said precursor tray;
- flowing a carrier gas from said carrier gas supply system through said film precursor vaporization system;
- heating said film precursor to form said film precursor vapor in said carrier gas; and
- exposing said substrate to said film precursor vapor.

15. The method of claim 14, wherein heating said film precursor is to a temperature of approximately 40 degrees C. or greater.

* * * * *